United States Patent
Melisaris et al.

(10) Patent No.: US 6,177,232 B1
(45) Date of Patent: Jan. 23, 2001

(54) SEDIMENTATION STABILIZED RADIATION-CURABLE FILLED COMPOSITIONS

(75) Inventors: Anastasios P. Melisaris, Stevenson Ranch; Thomas H. Pang, Castaic, both of CA (US)

(73) Assignee: Vantico Inc., Brewster, NY (US)

( * ) Notice: Under 35 U.S.C. 154(b), the term of this patent shall be extended for 0 days.

(21) Appl. No.: 09/115,085

(22) Filed: Jul. 14, 1998

Related U.S. Application Data

(60) Provisional application No. 60/053,214, filed on Jul. 21, 1997.

(51) Int. Cl.⁷ .............................. G03F 7/028; G03F 7/095
(52) U.S. Cl. ............................................................ 430/280.1
(58) Field of Search ............................. 430/280.1, 281.1, 430/270.1, 288.1, 284.1, 269, 15; 522/77, 71, 83, 78; 264/401

(56) References Cited

U.S. PATENT DOCUMENTS

| | | | |
|---|---|---|---|
| 3,708,296 | 1/1973 | Schlesinger | 96/33 |
| 4,575,330 | 3/1986 | Hull | 425/174.4 |
| 5,158,989 | * 10/1992 | Ogitani et al. | 522/77 |
| 5,368,619 | 11/1994 | Culler | 51/308 |
| 5,731,388 | * 3/1998 | Suzuki et al. | 525/404 |
| 5,753,722 | * 5/1998 | Itokawa et al. | 522/83 |

FOREIGN PATENT DOCUMENTS

| | | |
|---|---|---|
| 0470705 | 2/1992 | (EP) . |
| 0499485 | 8/1992 | (EP) . |

* cited by examiner

*Primary Examiner*—Cynthia Hamilton
(74) *Attorney, Agent, or Firm*—David R. Crichton; Michele A. Kovaleski

(57) ABSTRACT

The present invention relates to a process for the production of three-dimensional articles by stereolithography using a radiation-curable composition containing a mixture of at least one cationically polymerizable compound and/or at least one free radical polymerizable compound, at least one filler material, at least one photoinitiator for cationic and/or radical polymerizations and at least one antisedimentation agent. An organic viscosity stabilizer material soluble in the base resin may optionally be brought into contact with the composition. A filler material can be introduced in the composition in an effective amount sufficient to at least delay or prevent a significant viscosity increase. The present invention also relates to cured articles resulting from said processes and a process for preparing said compositions.

30 Claims, No Drawings

SEDIMENTATION STABILIZED RADIATION-CURABLE FILLED COMPOSITIONS

This application claims the benefit under 35 U.S.C. 119(e) of U.S. Provisional Application No. 60/053,214, Filed Jul. 21, 1997.

The present invention relates to a process for the production of three-dimensional articles by stereolithography using a stabilized radiation-curable filled composition based on a cationically polymerizable compound and/or at least one free radical polymerizable compound, a filler material, at least one photoinitiator for cationic and/or radical polymerization, and a selected inorganic antisedimentation agent, and cured articles resulting from said process. An organic viscosity stabilizer material soluble in the base resin or a filler that acts as a viscosity stabilizer may be incorporated into the composition.

BACKGROUND OF THE INVENTION

Radiation-curable compositions comprising a cationically polymerizable compound and a photoinitiator for cationic polymerization are well-known in the industry and are used, for example, as radiation-curable paints, photoresists or for the production of three-dimensional articles by stereolithography. The photoinitiator for the cationic polymerization is formed in these compositions by a strong latent acid, i.e. a compound which undergoes a photoreaction on irradiation to form a strong acid, which then initiates the cationic polymerization.

In a stereolithographic process, as described in greater detail in U.S. Pat. No. 4,575,330, which is incorporated herein by reference, three-dimensional articles are built up in layers from the radiation-curable composition by first irradiating a layer of the composition imagewise. The composition is irradiated either over the entire area or in a predetermined pattern (with linear or vectorial scanning) using a UV/VIS light source until the layer has solidified in a desired layer thickness in the irradiated areas. A new layer of the radiation-curable composition is then provided over the layer that has already been solidified. The new layer is similarly irradiated over the entire area or in a predetermined pattern forming a second solidified layer adhering to the first.

This layering and irradiating operation is continued so that repeated covering of the previously solidified material with new layers of curable composition and subsequent irradiation of the new layer produces a three-dimensional article, also known as the "green part". The so-called "green part" is not fully cured, but is sufficiently solidified to withstand its own weight. The green part is removed from the bath containing the radiation-curable composition and post-cured in a different way, such as by heat and/or further irradiation to produce a final cured article or product.

It is known that the addition of filler material, such as inorganic materials, ceramics, composites, metallic filler, organic polymeric material, glass, thermoplastics, silica beads, etc. to radiation-curable compositions improves most of the thermomechanical and mechanical properties of resulting cured articles. One of the significant drawbacks or limitations of filled resin systems in stereolithography systems is sedimentation of the filler material. Stereolithographic compositions are used for extended periods of times, upwards of up to a year. Over time, the filler material tends to settle to the bottom of the vat. As the filler settles, the viscosity and specific gravity of the filled composition gradually drops at the top of the vat where the part is built, and substantially increases at the bottom of the vat. In addition, the refractive index of the filled composition gradually changes depending on sedimentation rate; the change is significant for unstabilized compositions that show high sedimentation rate.

Consistent physical properties and accuracy are two of the most important properties for cured articles made in stereolithographic systems. However, multiple cured articles prepared over an extended period of time from an unstabilized filled composition exhibit different thermomechanical and mechanical properties. Additionally, changes in viscosity, specific gravity and the refractive index create a situation wherein the original building parameters of the originally homogenous filled composition are no longer valid. A requirement that the building parameters be constantly monitored and/or modified leads to a stereolithographic part building process that is problematic, inaccurate and unpredictable. Accordingly, one of the objectives of the present invention is to prevent filler sedimentation in stereolithographic process systems, and thereby ensure homogenous compositions and resulting cured articles.

It is well-known that inorganic or organic antisedimentation agents can be incorporated into filled resin compositions to reduce sedimentation. Organic antisedimentation agents have been used in the paint industry as thixotroping agents to provide antisettling and sag-resistance properties. The most significant organic antisedimentation agents are: 1) castor wax derivatives, 2) particles of synthetic polyamide waxes, 3) synthetic polyurethane, 4) a micronized hydrogenated castor oil or a polyamide modified micronized hydrogenated castor oil and 5) crosslinked carboxylvinyl polymer.

The organic antisedimentation agents include homopolymers of acrylic acid crosslinked with an allyl ether of pentaerythritol, an allyl ether of sucrose, or an allyl ether of propylene. The crosslinked acrylic acid is neutralized with a suitable alkali or amine. The particles of synthetic polyamide waxes, synthetic polyurethane, polyamide modified micronized hydrogenated castor oil and crosslinked carboxylvinyl polymer may not be used in stereolithographic filled compositions that are cured via a cationic photoinitiator due to the basic nature of said agents or neutralized forms of said agents. Said agents or neutralized forms of said agents reduce the photospeed of a composition. Castor wax products, on the other hand, may be too hydrophobic and exhibit phase separation within the filled composition.

Conventional inorganic antisedimentation agents, such as Aerosil and Cabosil type products, are acidic. Many antisedimentation agents and filler materials cause an undesired viscosity increase of the stereolithographic filled compositions during extended periods of time, and drastically, reduce the shelf-life of the filled composition. As described above, the continuous viscosity increase creates problems in part building.

It is known that the viscosity of stereolithographic compositions can be increased to as much as 50,000 cps. at part building temperatures (approximately 25 to 45° C.) in order to support the filler material. However, a composition having such a high viscosity is not suitable for currently available stereolithography systems. A highly viscous composition is undesirable in stereolithographic systems due to the potential for catastrophic part failure and increased leveling time of the top liquid layer in the bath. The increased time for leveling can significantly reduce the productivity of a stereolithographic device.

A filled composition comprising at least one cationically and/or radically cured compound(s), at least one photoinitiator, at least one filler such as crystalline or amorphous silica, and at least one inorganic antisedimentation agent such as Aerosil® or Cabosil® shows unacceptably low viscosity stability for stereolithography applications. Without intending to be bound to any particular technical theory, the acidic nature of the hydroxyl groups of the filler and the antisedimentation agents are believed to contribute to the viscosity instability problem of the filled compositions. Hence, a filled composition that is stabilized against sedimentation by the addition of an inorganic antisedimentation agent, as described above, can not be useful for conventional stereolithographic applications. To date, the antisedimentation problem of stereolithography filled compositions has not been solved due to the inability of overcoming the viscosity instability problem.

The present invention overcomes sedimentation problems on stereolithography filled compositions without creating destabilization of the viscosity of the filled composition. The invention is particularly useful for filled compositions in stereolithographic systems.

SUMMARY OF THE INVENTION

Through extensive research, the inventors herein have overcome the undesired viscosity increase problem that is due to the existence of antisedimentation agents and fillers in the filled composition by either adding an effective amount of an organic viscosity stabilizer into the formulation and/or by adding at least one filler material in an effective amount sufficient to stabilize the viscosity of the overall composition. A viscosity stabilizer, as the term is used herein, delays or prevents a significant viscosity increase of the stereolithographic composition that results from the presence of free acid. The phrase "delays a significant viscosity increase" means that the filled composition comprising the viscosity stabilizer remains stable and is acceptable for most stereolithographic applications throughout its shelf-life. Accordingly, the present invention relates to a process for the production of three-dimensional objects by stereolithography using a radiation-curable composition comprising a mixture of at least one cationically polymerizable compound and/or at least one free radical polymerizable compound, at least one filler material, at least one photoinitiator for cationic and/or radical polymerizations and at least one inorganic antisedimentation agent. Preferably, the inorganic antisedimentation agent has a pH value equal to or less than about 9. The cationically polymerizable compound in the radiation-curable composition can be at least one compound containing at least a 1,2-epoxide, vinyl ether, lactone, acetal, cyclic sulfide, cyclic ether or siloxane group.

The inorganic antisedimentation agent can be selected from the group of hydrophobic silica, hydrophilic silica, fumed silica, precipitated silica, synthetic silica, surface treated silica, and mixtures thereof. The filler can be added in an effective amount sufficient to stabilize the viscosity of the overall composition. A mixture of filler materials can be used.

The radiation-curable composition can optionally further include at least one compound which can be cured by means of free radicals or a mixture of two or more of said free radically-polymerizable compounds, and a photoinitiator for free-radical polymerization.

In the alternative, the filler material can have a pH value greater than about 2.5 and/or the filler material can be at least in part surface treated with either an unreactive or reactive compound-coupling agent.

The present invention further relates to a process for the production of three-dimensional objects by stereolithography using a radiation-curable composition comprising a mixture of at least one cationically polymerizable compound and/or at least one free radical polymerizable compound, at least one filler material, at least one photoinitiator for cationic and/or radical polymerizations and an inorganic antisedimentation agent, in which the mixture is brought in contact with an organic viscosity stabilizer material. The inorganic antisedimentation agent preferably has a pH value equal to or less than about 9. The antisedimentation agent can be selected from the group of hydrophobic silica, hydrophilic silica, fumed silica, precipitated silica, synthetic silica, surface treated silicas, and mixtures thereof. The cationically polymerizable compound in the radiation-curable composition can be at least one compound containing at least a 1,2-epoxide, vinyl ether, lactone, acetal, cyclic sulfide, cyclic ether or siloxane group.

A mixture of filler materials can be used. The mixture of filler materials can include at least one filler having a pH value less than about 9 and at least one filler having a pH value equal to or greater than about 9.

The radiation-curable composition can optionally further include at least one compound which can be cured by means of free radicals or a mixture of two or more of said free radically-polymerizable compounds, and a photoinitiator for free-radical polymerization.

The present invention further relates to a cured three-dimensional article produced by subjecting a radiation-curable composition comprising a mixture of at least one cationically polymerizable compound and/or at least one free radical polymerizable compound, at least one filler material, at least one photoinitiator for cationic and/or radical polymerizations and an inorganic antisedimentation agent, to actinic radiation.

The present invention further relates to a cured three-dimensional article produced by subjecting a radiation-curable composition comprising a mixture of at least one cationically polymerizable compound and/or at least one free radical polymerizable compound, at least one filler material, at least one photoinitiator for cationic and/or radical polymerizations, an inorganic antisedimentation agent, in which an organic viscosity stabilizer material, is brought into contact with the composition, to actinic radiation.

The present invention further relates to a process for manufacturing a radiation curable composition comprising combining a mixture of at least one cationically polymerizable compound and/or at least one free radically polymerizable compound, at least one filler material which at least delays or prevents a significant viscosity increase, at least one photoinitiator for cationic and/or radical polymerizations and an inorganic antisedimentation agent in a reaction vessel.

The present invention further relates to a process for manufacturing a radiation curable composition comprising combining a mixture of at least one cationically polymerizable compound and/or at least one free radical polymerizable compound, at least one filler material, a photoinitiator for cationic polymerization, an inorganic antisedimentation agent and an organic stabilizer material in a reaction vessel.

DETAILED DESCRIPTION OF THE INTENTION

The radiation-curable compositions for which the novel stabilization process is suitable can contain any conventional cationically polymerizable organic compounds, either alone or in the form of a mixture with at least one further compound which can be polymerized cationically or by another mechanism, for example by means of free radicals. These include, for example, ethylenically unsaturated compounds which can be polymerized by a cationic mechanism, such as monoolefins and diolefins, for example isobutylene, butadiene, isoprene, styrene, α-methylstyrene, divinylbenzenes, N-vinylpyrrolidone, N-vinylcarbazole and acrolein, or vinyl ethers, for example methyl vinyl ether, isobutyl vinyl ether, trimethylolpropane trivinyl ether, ethylene glycol divinyl ether; cyclic vinyl ethers, for example 3,4-dihydro-2-formyl-2H-pyran (dimeric acrolein) and the 3,4-dihydro-2H-pyran-2-carboxylic ester of 2-hydroxymethyl-3,4-dihydro-2H-pyran, and vinyl esters, for example vinyl acetate and vinyl stearate. They can also be cationically polymerizable heterocyclic compounds, for example ethylene oxide, propylene oxide, epichlorohydrin, glycidyl ethers or monohydric alcohols or phenols, for example n-butyl glycidyl ether, n-octyl glycidyl ether, phenyl glycidyl ether and cresyl glycidyl ether;

glycidyl acrylate, glycidyl methacrylate, styrene oxide and cyclohexene oxide; oxetanes, such as 3,3-dimethyloxetane and 3,3-di(chloromethyl)oxetane; tetrahydrofuran; dioxolanes, trioxane and 1,3,6-trioxacyclooctane; lactones, such as β-propiolactone, γ-valerolactone and ε-caprolactone; spiroether carbonates spiroether esters; thiiranes, such as ethylene sulfide and propylene sulfide; epoxy resins; linear and branched polymers containing glycidyl groups in the side chains, for example homopolymers and copolymers of polyacrylate and polymethacrylate glycidyl esters. Other suitable cationically polymerizable compounds are methylol compounds, which include amino resins, for example the N-hydroxymethyl-, N-methoxymethyl-, N-n-butoxymethyl- and N-acetoxymethyl derivatives of amides or amide-like compounds, for example cyclic ureas, such as ethyleneurea (imidazolidin-2-one), hydantoin, urone (tetrahydrooxadiazin-4-one), 1,2-propyleneurea (4-methylimidazolidin-2-one), 1,3-propyleneurea (hexahydro-2H-pyrimid-2-one), hydroxypropyleneurea (5-hydroxyhexahydro-2H-pyrimid-2-one), 1,3,5-melamine and further polytriazines, such as acetoguanamine, benzoguanamine and adipoguanamine. If desired, use can also be made of amino resins containing both N-hydroxymethyl and N-acetoxymethyl groups, for example hexamethylolmelamin, in which 1 to 3 of the hydroxyl groups have been etherified by means of methyl groups. Other suitable methylol compounds are phenolic resins, in particular resols prepared from a phenol and an aldehyde. The phenols which are suitable for this purpose include phenol itself, resorcinol, 2,2-bis(p-hydroxyphenyl)propane, p-chlorophenol, a phenol which is substituted by one or two alkyl groups each having 1 to 9 carbon atoms, such as o-, m- or p-cresol, the xylenols, p-tert-butylphenol and p-nonylphenol, and also phenyl-substituted phenols, in particular p-phenylphenol. The aldehyde condensed with the phenol is preferably formaldehyde, but other aldehydes, such as acetaldehyde and furfural, are also suitable. If desired, a mixture of such curable phenol-aldehyde resins can be used.

Particularly important cationically polymerizable compounds are epoxy resins having on average more than one 1,2-epoxide group in the molecule. Such resins can have an aliphatic, aromatic, cycloaliphatic, araliphatic or heterocyclic structure; they contain epoxide groups as side groups, or these groups form part of an alicyclic or heterocyclic ring system. Epoxy resins of these types are known in general terms and are commercially available. The following may be mentioned by way of examples of epoxy resins of this type:

I) Polyglycidyl and poly(β-methylglycidyl) esters obtainable by reacting a compound containing at least two carboxyl groups in the molecule and epichlorohydrin or glycerol dichlorohydrin or β-methylepichlorohydrin. The reaction is expediently carried out in the presence of bases. The compounds containing at least two carboxyl groups in the molecule can be, for example, aliphatic polycarboxylic acids. Examples of these polycarboxylic acids are glutaric acid, adipic acid, pimelic acid, suberic acid, azelaic acid, sebacic acid or dimerized or trimerized linoleic acid. However, it is also possible to employ cycloaliphatic polycarboxylic acids, for example tetrahydrophthalic acid, 4-methyltetrahydrophthalic acid, hexahydrophthalic acid or 4-methylhexahydrophthalic acid. It is also possible to use aromatic polycarboxylic acids, for example phthalic acid, isophthalic acid, trimellitic acid or pyromellitic acid. Use can also be made of carboxyl-terminated adducts, for example of trimellitic acid and polyols, for example glycerol or 2,2-bis(4-hydroxycyclohexyl)propane.

II) Polyglycidyl or poly(β-methylglycidyl) ethers obtainable by reacting a compound containing at least two free alcoholic hydroxyl groups and/or phenolic hydroxyl groups and a suitably substituted epichlorohydrin under alkaline conditions, or in the presence of an acidic catalyst followed by treatment with alkali. Ethers of this type are derived, for example, from acyclic alcohols, such as ethylene glycol, diethylene glycol and higher poly(oxyethylene)glycols, propane-1,2-diol, or poly(oxypropylene)glycols, propane-1,3-diol, butane-1,4-diol, poly(oxytetramethylene) glycols, pentane-1,5-diol, hexane-1,6-diol, hexane-2,4,6-triol, glycerol, 1,1,1-trimethylolpropane, bistrimethylolpropane, pentaerythritol, sorbitol, and from polyepichlorohydrins. However, the ethers can also be derived from cycloaliphatic alcohols, such as 1,3- or 1,4-dihydroxycyclohexane, bis(4-hydroxycyclohexyl)methane, 2,2-bis(4-hydroxycyclohexyl)

propane or 1,1-bis(hydroxymethyl)cyclohex-3-ene, or they contain aromatic rings, such as N,N-bis(2-hydroxyethyl) aniline or p,p'-bis(2-hydroxyethylamino)diphenylmethane. Glycidyl ethers can also be derived from monocyclic phenols, for example from resorcinol or hydroquinone, or they can be based on polycyclic phenols, for example on bis(4-hydroxyphenyl)methane (bisphenol F), 2,2-bis-(4-hydroxyphenyl)propane (bisphenol A), or condensation products, obtained under acidic conditions, of phenols or cresols with formaldehyde, such as phenol-novolaks and cresol-novolaks.

III) Poly-(N-glycidyl) compounds are obtainable, for example, by dehydrochlorination of the products of the reaction of epichlorohydrin with amines containing at least two amine hydrogen atoms. These amines are, for example, n-butylamine, aniline, toluidine, m-xylylenediamine, bis(4-aminophenyl)methane or bis(4-methylaminophenyl) methane. However, the poly(N-glycidyl) compounds also include N,N'-diglycidyl derivatives of cycloalkyleneureas, such as ethyleneurea or 1,3-propyleneurea, and N,N'-diglycidyl derivatives of hydantoins, such as of 5,5-dimethylhydantoin.

IV) Examples of suitable poly(S-glycidyl) compounds are di-S-glycidyl derivatives derived from dithiols, for example ethane-1,2-dithiol or bis(4-mercaptomethylphenyl) ether.

V) Examples of epoxide compounds in which the epoxide groups form part of an alicyclic or heterocyclic ring system are, for example, bis(2,3-epoxycyclopentyl) ether, 2,3-epoxycyclopentyl glycidyl ether, 1,2-bis(2,3-epoxycyclopentyloxy)ethane, bis(4-hydroxycyclohexyl) methanediglycidyl ether, 2,2-bis(4-hydroxycyclohexyl) propanediglycidyl ether, 3,4-epoxycyclohexylmethyl 3,4-epoxycyclohexanecarboxylate, 3,4-epoxy-6-methylcyclohexylmethyl 3,4-epoxy-6-methylcyclohexanecarboxylate, di(3,4-epoxycyclohexyl-methyl)hexanedioate, di(3,4-epoxy-6-methylcyclohexylmethyl) hexanedioate, ethylenebis(3,4-epoxycyclohexanecarboxylate), ethanediol di(3,4-epoxycyclohexylmethyl) ether, vinylcyclohexene dioxide, dicyclopentadiene diepoxide or 2-(3,4-epoxycyclohexyl-5, 5-spiro-3,4-epoxy)cyclohexane-1,3-dioxane.

However, it is also possible to use epoxy resins in which the 1,2-epoxide groups are bonded to different heteroatoms or functional groups. These compounds include, for example, the N,N,O-triglycidyl derivative of 4-aminophenol, the glycidyl ether glycidyl ester of salicylic acid, N-glycidyl-N'-(2-glycidyloxypropyl)-5,5-dimethylhydantoin or 2-glycidyloxy-1,3-bis(5,5-dimethyl-1-glycidylhydantoin-3-yl)propane. Also suitable are liquid prereacted adducts of such epoxy resins with curing agents for epoxy resins.

The photoinitiators for cationic polymerization can likewise be all compounds known for this purpose in the art. These include, for example, photoacid precursors, such as onium salts with anions of low nucleophilicity. Examples thereof are halonium salts, iodosyl salts or sulfonium salts, as described in EP-A153904, sulfoxonium salts, as described, for example, in EP-A35969, 44274, 54509 and 164314, or diazonium salts, as described, for example, in U.S. Pat. No. 3,708,296, each of which are incorporated herein by reference. Further cationic photoinitiators are metallocene salts, as described, for example, in EP-A94914 and 94915. A review of further common onium salt initiators and/or metallocene salts is given in "UV-Curing, Science and Technology", (Editor: S. P. Pappas, Technology Marketing Corp., 642 Westover Road, Stamford, Conn.) or "Chemistry & Technology of UV & EB Formulations for Coatings, Inks and Paints", Vol. 3 (edited by P. K. T. Oldring), which are incorporated herein by reference.

Particularly suitable photoinitiators for the cationic polymerization are compounds of the formulae (1), (2) and (3)

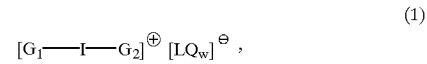

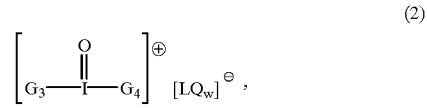

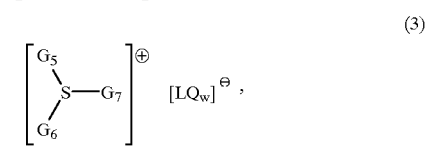

in which $G_1$, $G_2$, $G_3$, $G_4$, $G_5$, $G_6$ and $G_7$, are $C_6$–$C_{18}$aryl which is unsubstituted or substituted by suitable radicals, L is boron, phosphorus, arsenic or antimony, Q is a halogen atom or a part of the radicals Q in an anion $LQ_w$ can also be a hydroxyl group, and w is an integer corresponding to the valency of L plus 1. Examples of $C_6$–$C_{18}$aryl here are phenyl, naphthyl, anthryl and phenanthryl. Substituents which may be present on suitable radicals are alkyl, preferably $C_1$–$C_6$alkyl, such as methyl, ethyl, n-propyl, isopropyl, n-butyl, sec-butyl, isobutyl, tert-butyl and the various pentyl and hexyl isomers, alkoxy, preferably $C_1$–$C_6$alkoxy, such as methoxy, ethoxy, propoxy, butoxy, pentoxy and hexoxy, alkylthio, preferably $C_1$–$C_6$alkylthio, such as methylthio, ethylthio, propylthio, butylthio, pentylthio and hexyithio, halogen, such as fluorine, chlorine, bromine and iodine, amino groups, cyano groups, nitro groups and arylthio, such as phenylthio.

Examples of particularly advantageous halogen atoms Q are chlorine and in particular fluorine, examples of anions $LQ_w^-$ are, in particular, $BF_4^-$, $PF_6^-$, $AsF_6^-$, $SbF_6^-$ and $SbF_5(OH)^-$. The anion of the type $LQ_w^-$ can also advantageously be replaced by $CF_3SO_3^-$. Compounds containing two or more onium groups in the molecule, for example disulfonium compounds, are of course also suitable as initiators. Particularly frequent use is made of cationic photoinitiators of the formula (3) in which $G_5$, $G_6$ and $G_7$ are phenyl or biphenyl, or mixtures of these two compounds.

A further important type of cationic photoinitiators has the formula (4)

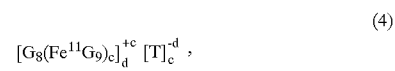

in which c is 1 or 2, d is 1, 2, 3, 4 or 5, T is a non-nucleophilic anion, for example $BF_4^-$, $PF_6^-$, $AsF_6^-$, $SbF_6^-$, $CF_3SO_3^-$, $C_2F_5SO_3^-$, n-$C_3F_7SO_3^-$, n-$C_4F_9SO_3^-$, n-$C_6F_{13}SO_3^-$, n-$C_8F_{17}SO_3^-$, $C_6F_5SO_3^-$, phosphorus tungstate ($PO_{40}W_{12}^{3-}$) or silicon tungstate ($SiO_{40}W_{12}^{4-}$), $G_8$ is a π-arene, and $G_9$ is an anion of a π-arene, in particular a cyclopentadienyl anion. Examples of π-arenes $G_9$ and anions of π-arenes $G_9$ which are suitable here are given in EP-A94915. Important π-arenes $G_8$ are toluene, xylene, ethylbenzene, cumene, methoxybenzene, methylnaphthalene, pyrene, perylene, stilbene, diphenylene oxide and diphenylene sulfide. Particular preference is given to cumene, methylnaphthalene and stilbene. The anion T is in particular $PF_6^-$, $AsF_6^-$, $SbF_6^-$, $CF_3SO_3^-$, $C_2F_5SO_3^-$, $n\text{-}C_3F_7SO_3^-$, $n\text{-}C_4F_9SO_3^-$, $n\text{-}C_6F_{13}SO_3-$ or $n\text{-}C_8F_{17}SO_3^-$. The ferrocene salts, like metallocene salts, can generally also be employed in combination with oxidants. Such combinations are described in EP-A126712.

The cationic photoinitiators can of course be added in the conventional effective amounts, for example in each case in amounts of from about 0.1 to 20 percent by weight, preferably from 1 to 10 percent by weight, based on the total amount of the mixture. In order to increase the light yield, sensitizers can also be employed, depending on the initiator type. Examples thereof are polycyclic aromatic hydrocarbons and aromatic keto compounds. Specific examples of preferred sensitizers are mentioned in EP-A153904.

The filler material can be organic or inorganic. Examples of organic filler materials are solid or hollow particles made of polymeric compounds, thermoplastics, core-shell, aramid, KEVLAR®, nylon, crosslinked polystyrene, crosslinked poly(methyl methacrylate), polystyrene or polypropylene. Examples of inorganic fillers are glass or silica beads, calcium carbonate, barium sulfate, talc, mica, glass or silica bubbles, metallic filers, ceramics and composites. Mixtures of organic and/or inorganic fillers can be used.

Further examples of preferred fillers are microcrystalline silica, crystalline silica, amorphous silica, mixtures of alkali aluminosilicates, feldspar, woolastonite, alumina trihydrate, surface treated alumina trihydrate, kaoline, modified kaolin, and hydrated kaolin. Each of the preferred fillers is commercially available. The most preferred filler materials are inorganic fillers, such as Imsil, Novasite, amorphous silica, feldspar, and alumina trihydrate.

A mixture of acidic filler materials, basic filler materials, and neutral filler materials can be used. Further, a mixture of at least one acidic, and/or at least one basic, and/or at least one neutral filler materials can be incorporated into the composition mixture. The pH value for filler materials can be determined by preparing an aqueous slurry mixture of filler based on conventional methods recommended by the filler suppliers.

The filler material can optionally be surfaced treated with compounds-coupling agents, such as methacryloxypropyltrimethoxysilane, beta-(3,4-epoxycyclohexyl)ethyl trimethoxysilane, gamma-glycidoxypropyl trimethoxysilane, methyl triethoxysilane. The most preferred coupling agents are comercially available from Osi Chemicals Corp. and other chemical suppliers. With respect to surface treated filler material, the pH value for the filler material is determined prior to any surface treatment operations.

The filler loading is preferably from about 2 to about 90%, more preferably from about 5 to about 50%, most preferably from about 5 to about 40% by weight with respect to the total weight of the filled resin composition.

Incorporation of the appropriate organic base or nucleophile into the filled composition, as a viscosity stabilizer, will neutralize the acid, and prevent premature polymerization. The undesired acid formation may be due, for example, to decomposition of the photoinitiator, for example owing to heat, moisture, unintentional exposure to light or scattered light, or by unintentional entrainment of acid. The organic viscosity stabilizer material is soluble in the base resin, and is particularly useful when one or more of the filler materials, antisedimentation agents or additives in the composition mixture cause undesired viscosity increase. The organic viscosity stabilizer material is preferably selected from the group consisting of nitrogen-containing organic compounds that more preferably have steric hindering groups on or near the nitrogen atom(s). Without intending to be bound to any particular technical theory, the steric hindrance is believed to prevent significant nucleophilic attack on the epoxy monomers. The organic viscosity stabilizer material, however, must still have sufficient basicity to effectively neutralize any prematurely generated acid. The organic viscosity stabilizer material should be used at very small levels in order to function as a viscosity stabilizer. At higher levels, it works as a catalyst that polymerizes the stereolithography resin.

The organic bases or nucleophiles, viscosity stabilizer materials, can be polymerizable or non-polymerizable. Examples of such stabilizers are urethane acrylates, nitrogen-containing epoxies, polyimides, pyridines, phenalthrolines, pyrimidines, pyrazines, imidazoles, triazoles, pyridazines, indoles, etc. primary, secondary and tertiary amines, porphins, hydrazines, ureas, nitriles, isonitriles, cyanates, and amides. Preferred stabilizers are sterically hindered tertiary amines, lactones, amides and urea derivatives. Most preferred are benzyl-N,N-dialkyl-amines and N,N-dialkyl-N-aryl-amines.

The concentration of the organic base or nucleophile, viscosity stabilizer material is highly dependent on the strength of basicity, chemical structure, molecular weight and stereochemistry of the stabilizer, as well as on the specific chemical structure, and properties of the photoacid precursor, such as thermal stability, shelf-life, etc. Typically, the lower the shelf-life and thermal and hydrolytic stability of the photoacid precursor, the higher the concentration of the organic base, viscosity stabilizer material. Therefore the concentration may vary from 5 ppm by weight to 20% by weight in the filled composition. As an example, for the viscosity stabilizer, benzyl-N,N'-dimethylamine (BDMA) the concentration is preferably less than 500 ppm by weight per one percent by weight of the photoacid precursor UVI-6974, Union Carbide, Danbury, Conn., in the overall filled composition. That is, a filled composition containing one percent by weight of the above photoacid precursor requires less than 500 ppm of BDMA. Further, a filled composition containing two percent by weight of the above photoacid precursor requires less than 1000 ppm of BDMA. More preferably, the concentration of BDMA, viscosity stabilizer material is in the range of about 5 to about 400 ppm by weight (stabilizer) per one percent by weight of photoacid precursor (UVI-6974) and most preferably in the range of about 5 to about 250 ppm by weight (stabilizer) per one percent by weight of photoacid precursor, in the overall filled composition. Preferably, the concentration of benzyl-N,N'-dialkylamine viscosity stabilizers (having molecular weights close to that of BDMA) in the overall composition is in the range of about 5 to 5000 ppm by weight, more preferably in the range of about 30 to 1000 ppm by weight, in the overall filled composition. Concentration levels may vary from the values indicated in the above example as different members of the benzyl-N,N'-dialkylamine family are used. As their molecular weight increases, the concentration required to obtain a desired result typically increases. Benzyl-N,N-dialkyl-amines have been widely used as catalysts (polymerization promoters) at high concentrations. As an example BDMA has been widely used as a catalyst to crosslink epoxy systems at concentrations about or over 1% by weight. BDMA, however, has never been used as a viscosity stabilizer (polymerization inhibitor) for epoxy systems. The concentration of the organic viscosity stabilizer depends on the strength of basicity, molecular weight, chemical structure and stereochemistry, as well as on the specific chemical structure and properties of the photoacid precursor such as thermal stability, shelf-life, etc. The term "photoacid precursor" means a compound or a mixture of compounds that form acid(s) when exposed to radiant energy. Therefore, the concentration of the organic viscosity stabilizer may vary between 5 ppm to about 20% by weight.

The inorganic antisedimentation agents materials are preferably synthetic precipitated or fumed silicas that contain siloxane and silanol groups. The surface of the antisedimentation agents can be chemically or physically modified by treatment with organosilanes or various coatings such as waxes, etc. to change the hydrophylic nature of the antisedimentation agent. Differences in particle size, particle structure, degree of hydrophylicity or hydrophobicity, surface treatment have an impact on the rheological characteristics of a composition containing said antisedimentation agent. When antisettling agents are dispersed in liquids, the silanol groups interact with each other via hydrogen bonds, thereby forming a three dimensional network. When the system is mechanically stressed, whether through stirring or shaking, the network of hydrogen bonds is broken. The extent of network breakdown is determined by the type and duration of the mechanical stress action. The thickened system thereby becomes more fluid again. Upon termination of the mechanical stress, the antisedimentation agent compounds interact, and the viscosity of the composition reaches its original value. The thickening and thixotropic effects depend upon the polarity of the system. Polarity is understood to be the capability of the liquid molecules to form hydrogen bonds.

Commercial antisedimentation agents include numerous grades. Examples of commercially available antisedimentation agents are Aerosil from Degussa Corp., Hi-Sil silica thickener from PPG Industries, and Cabosil from Cabot Corp.

The most preferred antisedimentation agents are hydrophobic silica, hydrophilic silica, fumed silica, precipitated silica, synthetic silica, surface treated silica, arc silica, gel silica. Preferred antisedimentation agents are available under the tradenames Aerosil, Hi-Sil and Cabosil. The surfaces of the most preferred antisediementation agents are chemically modified, at least in part, with hydrophobic coupling agents. The pH values for the antisedimentation agents is between about 2.5 and 9, more preferably about 3.5 and 8.5, most preferably the antisedimentation agent has a pH value less than about 7.5.

The antisedimentation agent should be added in amounts effective to generally prevent a level of settling when subjected to accelerated thermal aging at 65° C. over a 18 day period not to exceed 35%, more preferably 25%. However, this range may substantially change to higher or lower values depending on the specific stereolithographic application. The antisedimentation level can be individually adjusted to desired levels by varying the type, concentration, particle size, surface area, surface treatment of the antisedimentation agent in the filled composition. Parameters that need to be considered are the desired final viscosity and degree of thixotropy of the filled composition, degree of filler loading, stereolithography building parameters, part complexity, etc. The antisedimentation agents are added to the overall composition in the range of about 0.2 and 20% by weight, most preferably about 0.1 to 4% by weight. In order to overcome the addition of further antisedimentation agent, an organic viscosity stabilizer material may be incorporated.

The radiation-curable compositions can also comprise further constituents usually employed in the art of photopolymerizable materials, for example inert solvents suitable for the particular components, or conventional additives, such as stabilizers, for example UV stabilizers, air-release agents, leveling agents, wetting agents, flow-control agents, defoamers, surfactants, dyes, or pigments. The additives are employed in each case in the effective amount for the desired purpose and can make up a total of, for example, up to 20 percent by weight of the novel compositions, most preferably up to 8%.

The novel stabilization process is particularly suitable for use in stereolithography. The present invention therefore relates to a process for the production of three-dimensional articles by stereolithography using a radiation-curable composition comprising a cationically polymerizable compound and a photoinitiator for cationic polymerization.

Curable compositions which are particularly suitable for stereolithography in this case are based, in particular, on liquid epoxy resins as cationically curable compounds, for example the epoxy resins mentioned above. These are particularly preferably so-called hybrid systems, i.e. compositions which contain at least one compound which can be cured by means of free radicals and a free-radical polymerization photoinitiator which is suitable therefor, as well as the cationically curable components. Such hybrid systems are described, for example, in EP-A-0360869 and EP-A-0605361, whose description should be regarded as part of this description.

The compounds which can be polymerized by means of free radicals can be used, for example, in amounts of from 0 to 80 percent by weight, based on the total composition. For example, the composition can comprise from 5 to 30 percent by weight of components which can be cured by means of free radicals and from 70 to 95 percent by weight of cationically curable components. The compounds which can be polymerized by means of free radicals are frequently monoacrylates, diacrylates and polyacrylates having an acrylate functionality of up to 9 or corresponding methacrylates, or vinyl compounds having a vinyl functionality of up to 6.

Examples of suitable mono(meth)acrylates are acrylate, allyl methacrylate, methyl, ethyl, n-propyl, n-butyl, isobutyl, n-hexyl, 2-ethylhexyl, n-octyl, n-decyl and n-dodecyl acrylate and methacrylate, 2-hydroxyethyl, 2- and 3-hydroxypropyl acrylate and methacrytate, 2-methoxyethyl, 2-ethoxyethyl and 2- or 3-ethoxypropyl acrylate, tetrahydrofurfuryl methacrylate, 2-(2-ethoxyethoxy)ethyl acrylate, cyclohexyl methacrylate, 2-phenoxyethyl acrylate, glycidyl acrylate and isodecyl acrylate, and examples of suitable mono-N-vinyl compounds are n-vinyl-pyrrolidone and N-vinylcaprolactam. Such products are also known and some are commercially available, for example from the Sartomer Company.

Examples of suitable additional di(meth)acrylates are the di(meth)acrylates of cycloaliphatic or aromatic diols, such as 1,4-dihydroxymethylcyclohexane, 2,2-bis(4-hydroxycyclohexyl)propane, bis(4-hydroxycyclohexyl) methane, hydroquinone, 4,4'-dihydroxybiphenyl, bisphenol A, bisphenol F, bisphenol S, ethoxylated or propoxylated bisphenol A, ethoxylated or propoxylated bisphenol F or ethoxylated or propoxylated bisphenol S. Such di(meth) acrylates are known, and some are commercially available.

The di(meth)acrylates can also be compounds of the formulae (5), (6), (7) or (8)

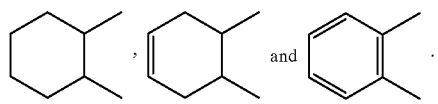

The di(meth)acrylates of the formulae (5) and (6) are known, and some are commercially available, for example under the name SR®349 and Novacure®3700, and can be prepared by reacting ethoxylated bisphenols, in particular ethoxylated bisphenol A, or bisphenol diglycidyl ethers, in particular bisphenol A diglycidyl ether, with (meth)acrylic acid.

In the same way, compounds of the formulae (7) and (8) can be prepared by reacting a diglycidyl ether of the formula (7a):

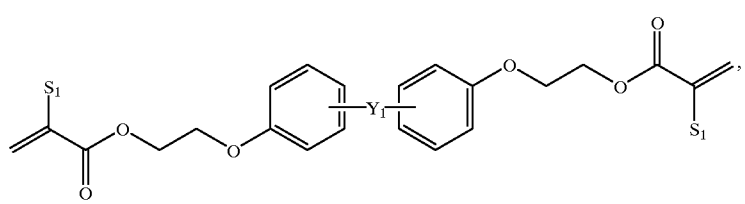

(5)

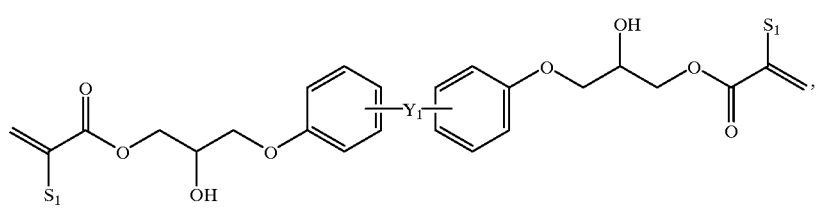

(6)

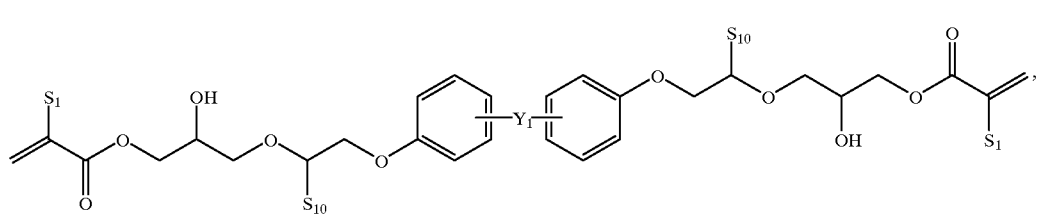

(7)

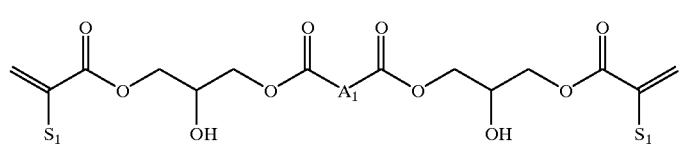

(8)

in which $S_1$ is a hydrogen atom or methyl, $Y_1$ is a direct bond, $C_1$–$C_6$alkylene, —S—, —O—, —SO—, —SO$_2$— or —CO—, $S_{10}$ is a $C_1$–$C_8$alkyl group, a phenyl group which is unsubstituted or substituted by one or more $C_1$–$C_4$alkyl groups, hydroxyl groups or halogen atoms, or a radical of the formula —CH$_2$—OS$_{11}$, in which $S_{11}$ is a $C_1$–$C_8$alkyl group or a phenyl group, and $A_1$ is a radical selected from the radicals of the formulae:

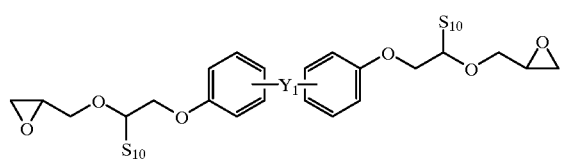
(7a)

or a diglycidyl ester of the formula (8a):

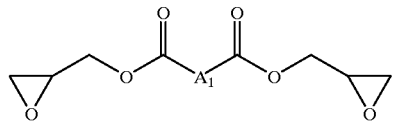
(8a)

where $S_{10}$, $Y_1$ and $A_1$ are as defined above, with (meth)acrylic acid.

The diacrylates can furthermore be a compound of the formula (9), (10), (11) or (12)

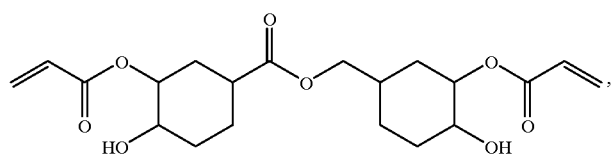
(9)

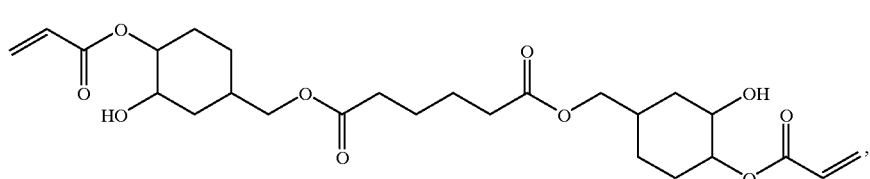
(10)

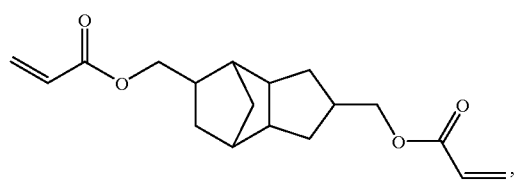
(11)

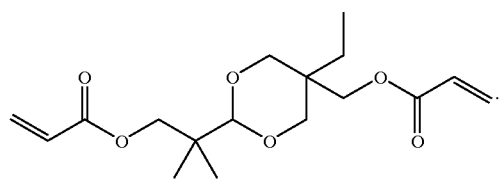
(12)

These compounds are known, and some are commercially available. The compounds of the formulae (9) and (10) can be prepared in a known manner by reacting the cycloaliphatic diepoxides of the formula (9a) or (10a)

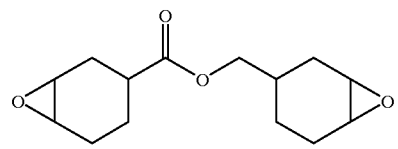
(9a)

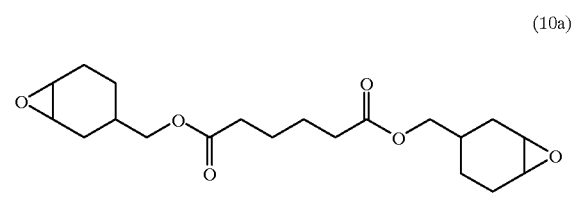
(10a)

respectively with (meth)acrylic acid. The compound of the formula (12) is commercially available under the name Kayarad® R-604.

Examples of suitable additional poly(meth)acrylates are monomeric or oligomeric aliphatic, cycloaliphatic or aromatic acrylates or methacrylates having a (meth)acrylate functionality of greater than 2, in particular tri-, tetra- or pentafunctional acrylates or methacrylates.

Examples of suitable aliphatic polyfunctional (meth) acrylates are the triacrylates and trimethacrylates of hexane-2,4,6-triol, glycerol or 1,1,1-trimethylolpropane, ethoxylated or propoxylated glycerol or 1,1,1-trimethylolpropane, and the hydroxyl-containing tri(meth)-acrylates obtained by reacting triepoxide compounds, for example the triglycidyl ether of said triols, with (meth)acrylic acid. It is also possible to use, for example, pentaerythritol tetra-acrylate, bistrimethylolpropane tetraacrylate, pentaerythritol monohydroxytriacrylate or -methacrylate or dipentaerythritol monohydroxypentaacrylate or -methacrylate.

In the novel compositions, the further compounds which can be polymerized by means of free radicals can also be hexafunctional or polyfunctional urethane acrylates or urethane methacrylates. These urethane (meth)acrylates are known to the person skilled in the art and can be prepared in a known manner, for example by reacting a hydroxy-terminated polyurethane with acrylic acid or methacrylic acid or by reacting an isocyanate-terminated prepolymer with hydroxyalkyl (meth)acrylates.

Examples of suitable tri(meth)acrylates are the products of the reaction of triglycidyl ethers of trihydric phenols and phenol- or cresol-novolaks containing three hydroxyl groups with (meth)acrylic acid.

The novel compositions preferably comprise at least one (meth)acrylate having an acrylate functionality of from 1 to 9 which is soluble in the composition; they particularly preferably comprise a liquid mixture of aromatic, aliphatic or cycloaliphatic (meth)acrylates having an acrylate functionality of from 2 to 9.

Other suitable photoinitiators for free-radical polymerization are all compound types which form free radicals on appropriate irradiation. Typical compounds of known photoinitiators are benzoins, such as benzoin, benzoin ethers, such as benzoin methyl ether, benzoin ethyl ether, benzoin isopropyl ether and benzoin phenyl ether, and benzoin acetate, acetophenones, such as acetophenone, 2,2-dimethoxyacetophenone and 1,1-dichloroacetophenone, benzil, benzil ketals, such as benzil dimethyl ketal and benzil diethyl ketal, anthraquinones, such as 2-methylanthraquinone, 2-ethylanthraquinone, 2-tert-butylanthraquinone, 1-chloroanthraquinone and 2-amylanthraquinone, furthermore triphenylphosphine, benzoylphosphine oxides, for example 2,4,6-trimethylbenzoyidiphenylphosphine oxide (Luzirin TPO), benzophenones, such as benzophenone and 4,4'-bis(N,N'-dimethylamino)benzophenone, thioxanthones and xanthones, acridine derivatives, phenazine derivatives, quinoxaline derivatives and 1-phenyl-1,2-propanedione 2-O-benzoyl oxime, 1-aminophenyl ketones and 1-hydroxyphenyl ketones, such as 1-hydroxycyclohexyl phenyl ketone, phenyl 1-hydroxyisopropyl ketone and 4-isopropyl-phenyl 1-hydroxyisopropyl ketone, all of which are known compounds.

Particularly suitable photoinitiators, which are usually used in combination with an He/Cd laser as light source, are acetophenones, such as 2,2-dialkoxybenzophenones and 1-hydroxyphenyl ketones, for example 1-hydroxycyclohexyl phenyl ketone and 2-hydroxyisopropyl phenyl ketone (2-hydroxy-2,2-dimethylacetophenone), in particular 1-hydroxycyclohexyl phenyl ketone.

Another class of free-radical photoinitiators usually employed when argon ion lasers are used are benzil ketals, for example benzil dimethyl ketal. The photoinitiator is in particular an α-hydroxyphenyl ketone, benzil dimethyl ketal or 2,4,6-trimethylbenzoyidiphenylphosphine oxide.

Another class of suitable free-radical photoinitiators comprises the ionic dye counterion compounds, which are capable of absorbing actinic radiation and generating free radicals which initiate the polymerization of substances such as (meth)acrylates or vinyl compounds. The novel mixtures comprising ionic dye-counterion compounds can be cured variably in this way using visible light in the adjustable wavelength range from 400 to 700 nm. Ionic dye-counterion compounds and their mode of action are known, for example from EP-A-0223587 and U.S. Pat. Nos. 4,751,102; 4772530 and 4,772,541. Examples which may be mentioned of suitable ionic dye-counterion compounds are the anionic dye-iodonium ion complexes, the anionic dye-pyryllium ion complexes and in particular the cationic dye-borate anion compounds of the formula

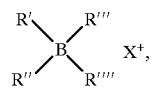

in which X⁺ is a cationic dye, and R', R", R'" and R"", independently of one another, are each an alkyl, aryl, alkaryl, allyl, aralkyl, alkenyl, alkynyl, alicyclic or saturated or unsaturated heterocyclic group.

It is known to the person skilled in the art that suitable photoinitiators must be selected for each chosen light source or, if appropriate, sensitized thereto. It has been recognized that the depth of penetration of the radiation into the composition to be polymerized and the working rate are in direct correlation with the absorption coefficient and the concentration of the photoinitiator. In stereolithography, preference is given to photoinitiators which cause the maximum number of free radicals or cationic particles to be formed for a certain laser energy, so that a preform of optimum strength is formed at the set curing depth. Both cationic and free-radical photoinitiators are added to the stereolithography mixtures in effective amounts, in particular in each case in amounts of from about 0.1 to about 10 percent by weight, based on the total weight of the mixture, it being essential, in particular, when lasers are used for the radiation curing, that the absorption ability of the mixtures is adjusted through the type and concentration of the photoinitiator so that the curing depth for normal laser speed is from about 0.1 to 2.5 mm. The total amount of photoinitiators in the novel compositions is preferably from 0.5 to 8 percent by weight.

It is of course also possible for the usual additives in this technology to be present in the stereolithography baths for the present invention. These are, for example, the above-mentioned additives or additional crosslinking agents, such as diols or polyols.

The viscosity of the overall composition should be less than 20,000 cps, more preferably between about 200 and 5,000 cps at part building temperatures (approximately 25–45° C.). Although the preferred part building temperatures are 25–45° C., the temperature may substantially extend outside of this range depending on the specific stereolithographic application and requirements.

The antisedimentation agents are most preferably combined with the rest of the composition in the following order. First all monomers or oligomers or polymers are added and stirred, followed by the addition and stirring of liquid surfactants including but not limited to the organic viscosity stabilizer, leveling agents, defoamers, wetting agents, air release agents, followed by the addition and stirring of the antisedimentation agent. After the mixture is well stirred, the filler material is added followed by stirring until the system is completely homogenized. Heating the filled composition at 65° C. for 3 hours achieves better wetting of the filler material, and helps the defoaming process when compared to room temperature stirring. In the past heating could not be an option for the stereolithography filled compositions because the viscosity of the filled system would increase due to gradual polymerization-gellation. However, due to the discovery of a viscosity stabilized filled system, room temperature stirring is no longer required.

The following non-limiting examples are provided to provide additional detail.

EXAMPLE 1

A filled composition is prepared in a reaction vessel. The components are added in the following manner. In a base liquid resin SL 5410, available from Ciba Specialty Chemicals Corporation, Tarrytown, N.Y., the following components are added: TMN-6 (wetting agent, available from Union Carbide, Danbury, Conn.) 0.35% by weight, SAG-47 (defoamer, available from Osi Chemicals Corp., Sisterville, W.Va.), and BDMA (organic viscosity stabilizer). The resulting solution is stirred at room temperature for 30 min. Then antisedimentation agent is added. The mixture is again stirred at room temperature for 20 minutes prior to the addition of the filler. The filled composition is stirred at room temperature for 30 minutes, followed by heating at 65° C. for 3 hours. The filled system is further stirred overnight under moderate shear mixing. The experimental results are shown in Table 1. Table 1 illustrates that the use of anti-sedimentation agents improves the sedimentation stability of the filled compositions. As an example, filled compositions D and K of Table 1 that contain Aerosil R 972 as the antisedimentation agent, show very good sedimentation stability, that ranges between 0 and 4.1% after accerelated aging tests for 18 days at 65° C. Note that formulations A through D and also F through K show good viscosity stability because their filled compositions comprise Minspar 10 and Alumina Trihydrate that perform at least as viscosity stabilizers, and their viscosity values slightly change after the accelerated thermal aging at 65° C. for 18 days.

When Imsil A8 (microcrystalline silica) was used as the filler for the filled composition E of Table 1 and Aerosil R 972 was used as the antisedimentation agent, the filled composition was highly unstable during the accelerated thermal aging at 65° C. The viscosity increased to 4600 and 33100 cps after 2 and 7 days, respectively, while aged at 65° C. The filled composition gelled after 10 days at 65° C.! E is very unstable and unacceptable for stereolithographic applications because it does not possess the appropriate level of viscosity stability. This example reveals that the radiation-curable filled compositions such as A, D, F and K comprising at least one cationically polymerizable compound, photoinitiator, filler and a antisedimentation agent are stable for use in stereolithographic applications because they are stabilized against viscosity instability. This was achieved by the means of a filler or a mixture of fillers such as Minspar or alumina trihydrate that at least delay or prevent a significant viscosity increase of the filled composition.

EXAMPLE 2

A filled composition is prepared in a reaction vessel. The components are added in the following manner. In a base liquid resin SL 5170, available from Ciba Specialty Chemicals Corporation, Tarrytown, N.Y., the following components are added: TMN-6 (wetting agent), SAG-47 (defoamer), and, as noted in Table 2, BDMA. The resulting solution is stirred at room temperature for 30 minutes. Then the antisedimentation agent is added. The mixture is again stirred at room temperature for 20 minutes prior to the addition of the filler material. The filled composition is stirred at room temperature for 30 minutes, followed by heating at 65° C. for 3 hours. The filled system is further stirred overnight under moderate shear mixing. The experimental results are shown in Table 2.

EXAMPLE 3

A filled composition is prepared in a reaction vessel. The components are added in the following manner. In a base resin SL 5170, available from Ciba Specialty Chemicals Corporation, Tarrytown, N.Y., TMN-6 (wetting agent) and SAG-47 (defoamer) are added. The resulting solution is stirred at room temperature for 30 min. Then antisedimentation agent is added. The mixture is again stirred at room temperature for 20 minutes prior to the addition of the mixture of fillers. The filled composition is stirred at room temperature for 30 minutes, followed by heating at 65° C. for 3 hours. The filled system is further stirred overnight under moderate shear mixing. The viscosity measured at 22° C. was 2540 cps. The filled composition was aged at 65° C. for 18 days. During the aging the viscosity increased to 35,000 cps. The rate of viscosity increase is too high for stereolithographic applications. To overcome the problem with viscosity increase, BDMA was added (150 ppm) in a fresh composition. The new filled composition was aged at 65° C. for 18 days; the viscosity increase was minimal.

TABLE 1

|  | A | B | C | D | E | F | G | H | I | K |
|---|---|---|---|---|---|---|---|---|---|---|
| SL 5410, base liquid resin; parts by weight | 64.55 | 64.05 | 63.55 | 62.55 | 63.00 | 79.55 | 79.05 | 78.55 | 78.55 | 77.55 |
| Minspar 10; parts by weight; pH = 9.2 | 35.00 | 35.00 | 35.00 | 35.00 | | | | | | |
| Imsil A8; parts by weight; pH = 4 | | | | | 35.00 | | | | | |
| Alumina trihydrate, SF4; parts by weight; pH = 10 | | | | | | 20.00 | 20.00 | 20.00 | 20.00 | 20.00 |
| Wetting agent; parts by weight | 0.35 | 0.35 | 0.35 | 0.35 | 0.35 | 0.35 | 0.35 | 0.35 | 0.35 | 0.35 |
| Defoamer; parts by weight | 0.10 | 0.10 | 0.10 | 0.10 | 0.10 | 0.10 | 0.10 | 0.10 | 0.10 | 0.10 |
| Cabosil TS530; parts by weight. | | 0.50 | | | | | 0.50 | | 1.00 | |
| Aerosil R972; parts by weight. | | | 1.00 | 2.00 | 2.00 | | | 1.00 | | 2.00 |
| Viscos. (cps) at 30° C. | | | | | | | | | | |
| 0 days at 65° C. | 1134 | 1626 | 1512 | 1772 | 1670 | 998 | 1156 | 1443 | 1452 | 1992 |
| 18 days at 65° C. | 1170 | | | 1869 | GELLED | 1384 | | | | 2881 |
| Sediment, aging at RT (%) | | | | | | | | | | |
| 5 days | 0 | 0 | 0 | 0 | 0 | 0 | 0 | 0 | 0 | 0 |
| 30 days | 7 | | | 0 | 5 | 3.6 | | | | 0 |
| 35 days | 7 | | | 0 | 4 | | | | | 0 |
| Sediment, aging, 65° C. (%) | — | — | — | — | — | — | — | — | — | — |
| 5 days | 26 | 17 | 6 | 1.5 | not applicable | 5.5 | 2.4 | 0.8 | 0.8 | 0 |
| 10 days | 40 | 33 | 8.5 | 4.0 | not applicable | 8 | 5 | 1.7 | 2.5 | 0 |
| 18 days | 41 | 37 | 12 | 4.1 | not applicable | 13 | 7.5 | 2.5 | 3.3 | 0 |

TABLE 2

|  | Materials Formulation name | 116-9A | 116-13A | 116-13B | 116-13C | 116-13D | 116-13E |
|---|---|---|---|---|---|---|---|
| 2 | SL 5170, base resin | 63.00 | 63.00 | 63.00 | 62.50 | 63.00 | 63.00 |
| 3 | Wetting agent | 0.10 | 0.10 | 0.10 | 0.10 | 0.10 | 0.10 |
| 4 | Defoamer | 0.10 | 0.10 | 0.10 | 0.10 | 0.10 | 0.10 |
| 5 | Aerosil, R-972 | 2.00 | 2.00 | 2.00 | 2.00 | 2.00 | 2.00 |
| 6 | Imsil A-8 | 35.00 | 35.00 | 35.00 | 35.00 | 15.00 | 15.00 |
| 7 | BDMA | | 0.03 | 0.10 | 0.50 | | |
| 8 | Minspar 10, untreated | | | | | 20.00 | |
| 9 | Minspar 10 + cycloepox. A-186 | | | | | | 20.00 |
| 10 | viscosity aging after 5 days at RT; measure. at 22° C. | 1670 | 2310 | 2700 | 2240 | 2020 | 2000 |
| 11 | Viscos. Aging at 65° C. after: | | | | | | |
| 12 | 2 days, in (cps) Check at 22° C. | 4660 | 2340 | 2920 | GELLED | 2040 | 2010 |
| 13 | 7 days, in (cps) Check at 22° C. | 33100 | 2350 | 6230 | | 2150 | 2100 |
| 14 | 14 days, in (cps) Check at 22° C. | GELLED | | | | | |
| 15 | 25 days, in (cps) Check at 22° C. | GELLED | 2390 | GELLED | GELLED | 2620 | 2350 |
| 16 | 39 days, cps, check at 22° C. | GELLED | 2650 | GELLED | GELLED | 4290 | 4110 |

What is claimed is:

1. A process for the production of three-dimensional objects by stereolithography comprising the steps:
    a) irradiating a layer of a radiation-curable composition imagewise, which composition comprises a mixture of at least one radiation polymerizable compound, at least one filler material, at least one photoinitiator for polymerization, and at least one inorganic antisedimentation agent selected from the group of hydrophobic silica, hydrophilic silica, amorphous silica, fumed silica, gel silica, precipitated silica, synthetic silica, surface treated silica, and mixtures thereof in an effective amount to provide desired sedimentation stability for the filled composition to produce a cured resin layer;
    b) providing a layer of radiation-curable composition over said cured resin layer; and
    c) repeating steps a) and b) until the desired three-dimensional object is formed.

2. A process according to claim 1, in which an organic viscosity stabilizer material is brought into contact with the composition.

3. A process according to claim 1, in which the radiation polymerizable compound is a cationically polymerizable compound.

4. A process according to claim 1, in which the radiation polymerizable compound is a free radical polymerizable compound.

5. A process according to claim 1, in which at least one of the radiation polymerizable compounds comprises at least a 1,2-epoxide, vinyl ether, lactone, acetal, cyclic sulfide, cyclic ether or siloxane group.

6. A process according to claim 1 wherein the inorganic antisedimentation agent has a pH value equal to or less than about 9.

7. A process according to claim 6, in which the radiation-curable composition comprises a mixture of filler materials.

8. A process according to claim 7, in which the mixture of filler materials comprises at least one filler having a pH value less than about 9 and at least one filler having a pH value equal to or greater than about 9.

9. A process according to claim 1, in which the filler material has a pH value equal to or greater than 9.

10. A process according to claim 1, in which the radiation-curable composition comprises at least one compound which can be cured by means of free radicals or a mixture of two or more of said free radically-polymerizable compounds, and a photoinitiator for free-radical polymerization.

11. A process according to claim 1, in which the filler material has a pH value greater than about 2.5.

12. A process according to claim 1, in which the surface of the filler material has been at least in part surface treated to chemically or physically bond a unreactive or reactive compound-coupling agent or coating material to the filler material.

13. A process for the production of three-dimensional objects by stereolithography comprising
   a) irradiating a layer of a radiation-curable composition imagewise, which composition comprises a mixture of at least one radiation polymerizable compound, at least one filler material, at least one photoinitiator for polymerization and an inorganic antisedimentation agent, in which the mixture is brought in contact with an organic viscosity stabilizer material selected from nitrogen-containing organic compounds having steric hindering groups on or in the vicinity of the nitrogen atom to produce a cured resin layer;
   b) providing a layer of radiation-curable composition over said cured resin layer; and
   c) repeating steps a and b until the desired three-dimensional object is obtained.

14. A process according to claim 13 wherein the inorganic antisedimentation agent has a pH value equal to or less than about 9.

15. A process according to claim 13, in which the antisedimentation agent is selected from the group of hydrophobic silica, hydrophilic silica, amorphous silica, fumed silica, precipitated silica, synthetic silica, gel silica, surface treated silicas, and mixtures thereof.

16. A process according to claim 13, in which the radiation-curable composition comprises a mixture of filler materials.

17. A process according to claim 16, in which the mixture of filler materials comprises at least one filler having a pH value less than about 9 and at least one filler having a pH value equal to or greater than about 9.

18. A process according to claim 13, in which the radiation-curable composition comprises at least one compound which can be cured by means of free radicals or a mixture of two or more of said free radically-polymerizable compounds, and a photoinitiator for free-radical polymerization.

19. A process for the production of three-dimensional objects by stereolithography comprising the steps:
   a) irradiating a layer of a radiation-curable composition imagewise, which composition comprises a mixture of at least one radiation polymerizable compound, at least one filler material, at least one photoinitiator for polymerization and an inorganic antisedimentation agent selected from the group of hydrophobic silica, hydrophilic silica, amorphous silica, fumed silica, gel silica, precipitated silica, synthetic silica, surface treated silica, and mixtures thereof, in which the at least one filler material delays or prevents a significant viscosity increase to produce a cured resin layer
   b) providing a layer of said radiation-curable composition over said cured resin layer; and
   c) repeating steps a) and b) until the desired three-dimensional object is formed.

20. A process for manufacturing a radiation curable composition comprising combining a mixture of at least one cationically polymerizable compound and at least one free radically polymerizable compound, at least one filler material, at least one photoinitiator for cationic and/or radical polymerizations and an inorganic antisedimentation agent selected from the group of hydrophobic silica, hydrophilic silica, amorphous silica, fumed silica, gel silica, precipitated silica, synthetic silica, surface treated silica, and mixtures thereof in a reaction vessel.

21. A process according to claim 20 wherein the inorganic antisedimentation agent has a pH value equal to or less than about 9.

22. A process for manufacturing a radiation curable composition comprising combining a mixture of at least one cationically polymerizable compound and at least one free radical polymerizable compound, at least one filler material, at least one photoinitiator for cationic and/or radical polymerizations, an inorganic antisedimentation agent and an organic viscosity stabilizer material selected from nitrogen-containing organic compounds having steric hindering groups on or in the vicinity of the nitrogen atom in a reaction vessel.

23. A process according to claim 22 wherein the inorganic antisedimentation agent has a pH value equal to or less than about 9.

24. A stabilized radiation-curable composition comprising a mixture of at least one cationically curing compound, at least one free radically curing compound, at least one filler material, at least one photoinitiator for polymerization and at least one inorganic antisedimentation agent selected from the group of hydrophobic silica, hydrophilic silica, amorphous silica, fumed silica, gel silica, precipitated silica, synthetic silica, surface treated silica, and mixtures thereof.

25. A composition according to claim 24 wherein the inorganic antisedimentation agent has a pH value equal to or less than about 9.

26. A stabilized radiation-curable composition comprising a mixture of at least one cationically curing compound, at least one free radical curing compound, at least one filler material, at least one photoinitiator for polymerization, an inorganic antisedimentation agent and an organic viscosity stabilizer material.

27. A composition according to claim 26 wherein the inorganic antisedimentation agent has a pH value equal to or less than about 9.

28. A composition according to claim 26 wherein the organic viscosity stabilizer material is at least one nitrogen-containing organic compound having steric hindering groups on or in the vicinity of the nitrogen atom.

29. A cured three-dimensional article produced by stereolithography by a) irradiating a layer of a radiation-curable composition imagewise, which composition comprises a mixture of at least one radiation polymerizable compound, at least one filler material, at least one photoinitiator for polymerization, and at least inorganic antisedimentation agent selected from the group consisting of hydrophobic silica, hydrophilic silica, amorphous silica, fumed silica, gel silica, precipitated silica, synthetic silica, surface seated silica, and mixtures thereof in effective amount to provide desired sedimentation stability for the filled composition to produce a cured resin layer;

b) providing a layer of radiation-curable composition over said cured resin layer; and c) repeating steps a) and b) until the desired three-dimensional article is formed.

30. A cured three-dimensional article produced by stereolithography by a) irradiating a layer of a radiation-curable composition imagewise, which composition comprises a mixture of at least one radiation polymerizable compound, at least one filler material, at least one photoinitiator for polymerization, and at least inorganic antisedimentation agent, in which the mixture is brought into contact with an organic viscosity stabilizer material selected from nitrogen-containing organic compounds having steric hindering groups on or in the vicinity of the nitrogen atom to produce a cured resin layer;

b) providing a layer of radiation-curable composition over said cured resin layer; and c) repeating steps a) and b) until the desired three-dimensional article is formed.

* * * * *